United States Patent
Yu et al.

(10) Patent No.: US 12,425,769 B2
(45) Date of Patent: Sep. 23, 2025

(54) AUDIO SYSTEM FOR PROVIDING ALTERNATIVE FREQUENCY, VEHICLE HAVING THE SAME, AND METHOD FOR PROVIDING ALTERNATIVE FREQUENCY

(71) Applicants: HYUNDAI MOTOR COMPANY, Seoul (KR); Kia Corporation, Seoul (KR)

(72) Inventors: Jae Kyu Yu, Hwaseong-si (KR); Oh Yun Kwon, Hwaseong-si (KR)

(73) Assignees: HYUNDAI MOTOR COMPANY, Seoul (KR); Kia Corporation, Seoul (KR)

( * ) Notice: Subject to any disclaimer, the term of this patent is extended or adjusted under 35 U.S.C. 154(b) by 178 days.

(21) Appl. No.: 18/519,384

(22) Filed: Nov. 27, 2023

(65) Prior Publication Data
US 2024/0406627 A1    Dec. 5, 2024

(30) Foreign Application Priority Data

Jun. 2, 2023 (KR) .................. 10-2023-0071613

(51) Int. Cl.
*H04R 3/04*    (2006.01)
*H04H 20/22*   (2008.01)
*H04R 1/22*    (2006.01)

(52) U.S. Cl.
CPC .............. *H04R 3/04* (2013.01); *H04R 1/22* (2013.01); *H04H 20/22* (2013.01); *H04R 2499/13* (2013.01)

(58) Field of Classification Search
CPC ........ H04R 3/04; H04R 1/22; H04R 2499/13; H04R 3/12; H03J 1/0075; H03J 2200/12; H03J 1/0083; H04H 60/40; H04H 60/51; H04H 20/22; H04H 2201/60; H04H 20/26; H04H 20/57; H04W 4/06; H04W 4/40
USPC ........................................... 381/98
See application file for complete search history.

(56) References Cited

U.S. PATENT DOCUMENTS

| 9,531,414 B2 * | 12/2016 | Preteseille ............... H04B 1/06 |
| 2015/0357996 A1 * | 12/2015 | Hu ........................ H03J 1/0075 455/154.1 |
| 2015/0365074 A1 * | 12/2015 | Jaisimha ................ H04H 20/22 455/164.1 |
| 2024/0405904 A1 * | 12/2024 | Lee ...................... H04H 20/106 |

\* cited by examiner

*Primary Examiner* — Xu Mei
(74) *Attorney, Agent, or Firm* — MORGAN, LEWIS & BOCKIUS LLP

(57) ABSTRACT

An audio system includes an audio device and a control device. The control device receives a second broadcast signal for an alternative frequency associated with the first broadcast signal with receive sensitivity of specified first reference sensitivity or more than the predetermined first reference sensitivity and verifies and stores a second radio frequency for transmitting the same broadcast as a radio broadcast of the first radio frequency, receives a third broadcast signal for the alternative frequency, when the first broadcast signal with receive sensitivity less than the specified first reference sensitivity, but greater than or equal to specified reference sensitivity is received, and change the frequency of the audio device from the first radio frequency to a third radio frequency, and changes the frequency of the audio device based on the second radio frequency, when the first broadcast signal with receive sensitivity less than the specified second reference sensitivity is received.

20 Claims, 11 Drawing Sheets

AUDIO SYSTEM FOR PROVIDING ALTERNATIVE FREQUENCY, VEHICLE HAVING THE SAME, AND METHOD FOR PROVIDING ALTERNATIVE FREQUENCY

CROSS-REFERENCE TO RELATED APPLICATION

The present application claims priority to Korean Patent Application No. 10-2023-0071613, filed on Jun. 2, 2023, the entire contents of which is incorporated herein for all purposes by this reference.

BACKGROUND OF THE PRESENT DISCLOSURE

Field of the Present Disclosure

The present disclosure relates to an audio system for providing an alternative frequency, a vehicle having the same, and a method for providing an alternative frequency, and more particularly, relates to receiving the same broadcast as a currently received radio broadcast through another frequency in a situation where the radio broadcast with quality of a certain level or less is received.

Description of Related Art

An audio device may be provided in a vehicle. A passenger (e.g., a driver and another passenger) of the vehicle may listen to a radio broadcast through the audio device.

For example, the audio vehicle may search for a radio frequency corresponding to a radio broadcast (e.g., a radio program) capable of being received in area where the vehicle is traveling and may receive a broadcast signal of the found radio frequency.

In general, when the vehicle moves away from a transmission station which transmits a broadcast signal, as radio waves are attenuated, a broadcast signal received by the audio device may be weakened and the noise of the signal may increase.

Thus, when the broadcast signal received from the transmission station is weakened, the audio device may automatically switch to another radio frequency for transmitting the same radio broadcast and may constantly provide the passenger with a radio service.

In this regard, the audio device may verify an alternative frequency in an adjacent to area which transmits the same broadcast as the currently received radio broadcast and may switch the currently set radio frequency to the alternative frequency, when the broadcast signal of the alternative frequency is better in quality than the currently received broadcast signal.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an audio device which may perform comparison and analysis (e.g., sound comparison) between the currently received radio broadcast and the radio broadcast of the alternative frequency to identify the two radio broadcasts are the same radio broadcast or different radio broadcasts, before switching the currently set radio frequency to the alternative frequency. In other words, the audio device may switch the currently set radio frequency to the alternative frequency in response to identifying that the two radio broadcasts are the same broadcast, thus preventing the currently received radio broadcast from switching to a different radio broadcast. This is to prevent the currently set radio broadcast frequency from switching to an alternative frequency in an adjacent to area predicted to transmit the same broadcast as the currently received radio broadcast in response that a different radio broadcast is substantially transmitted through the alternative frequency.

However, in response that a radio broadcast with quality of a certain level or less is received as the vehicle enters a shadow area or the like, because noise increases in the radio broadcast, it may be impossible to compare and analyze the radio broadcast with a radio broadcast of the alternative frequency. Thus, the currently set radio frequency may switch to the alternative frequency of the adjacent to area predicted to transmit the same broadcast as the currently received radio broadcast even in the situation where the different radio broadcast is substantially transmitted through the alternative frequency.

Various aspects of the present disclosure are directed to providing an audio device configured for automatically switching to another radio frequency for transmitting the same radio broadcast as a currently received radio broadcast even in response that the radio broadcast which has quality of a certain level or less as a vehicle enters a shadow area or the like is received and constantly providing a passenger with a radio service.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an audio system may include an audio device and a control device operationally connected to the audio device to set a frequency of the audio device to a first radio frequency corresponding to a selected radio broadcast and receive a first broadcast signal. The control device may receive a second broadcast signal for an alternative frequency associated with the first broadcast signal with receive sensitivity of predetermined first reference sensitivity or more than the predetermined first reference sensitivity while the first broadcast signal is received through the audio device and may verify and store a second radio frequency for transmitting a same broadcast as a radio broadcast of the first radio frequency based on a comparison between the first broadcast signal and the second broadcast signal, may receive a third broadcast signal for the alternative frequency, in response that the first broadcast signal with receive sensitivity less than the predetermined first reference sensitivity, but greater than or equal to predetermined second reference sensitivity is received, and change the frequency of the audio device from the first radio frequency to a third radio frequency corresponding to the alternative frequency based on a comparison between the first broadcast signal and the third broadcast signal, and may change the frequency of the audio device based on the second radio frequency, in response that the first broadcast signal with receive sensitivity less than the predetermined second reference sensitivity is received.

According to various exemplary embodiments of the present disclosure, the audio device may include a main tuner and a sub-tuner. The second broadcast signal and the third broadcast signal may be received through the sub-tuner. The control device may change a frequency of the main tuner.

According to various exemplary embodiments of the present disclosure, the control device may store a plurality of second radio frequencies, while the first broadcast signal with the receive sensitivity of the predetermined first reference sensitivity or more than the predetermined first reference sensitivity is received, and may obtain at least one of location information or time information associated with the audio system and change the frequency of the audio device to fourth radio frequency corresponding to the at least one of the location information or the time information among the second radio frequencies, in response that the first broadcast signal with the receive sensitivity less than the predetermined second reference sensitivity is received.

According to various exemplary embodiments of the present disclosure, the control device may change the frequency of the audio device from the first radio frequency to the third radio frequency, in response that receive sensitivity of the third broadcast signal is better than the receive sensitivity of the first broadcast signal and may be configured for controlling a predetermined operation of the audio device, in response that the receive sensitivity of the first broadcast signal is better than the receive sensitivity of the third broadcast signal. The predetermined operation of the audio device may include at least one of an operation of receiving a radio broadcast different from the selected radio broadcast, an operation of stopping receiving the radio broadcast, or an operation of playing a sound source stored in a storage medium.

According to various exemplary embodiments of the present disclosure, the control device may change the frequency of the audio device from the first radio frequency to the third radio frequency, in response that the first broadcast signal and the third broadcast signal are verified as broadcast signals of the same radio broadcast based on the comparison, and may be configured for controlling a predetermined operation of the audio device, in response that the first broadcast signal and the third broadcast signal are verified as broadcast signals of different radio broadcasts based on the comparison. The predetermined operation of the audio device may include at least one of an operation of receiving a radio broadcast different from the selected radio broadcast, an operation of stopping receiving the radio broadcast, or an operation of playing a sound source stored in a storage medium.

According to various exemplary embodiments of the present disclosure, the control device may store at least a portion of the first broadcast signal as reference data, while the first broadcast signal with the receive sensitivity less than the predetermined first reference sensitivity, but greater than or equal to the predetermined second reference sensitivity is received, and may receive a fifth broadcast signal for the alternative frequency, in response that the first broadcast signal with the receive sensitivity less than the predetermined second reference sensitivity is received, and may change the frequency of the audio device based on the second radio frequency, in response that the stored reference data and the fifth broadcast signal are verified as broadcast signals of different radio broadcasts.

According to various exemplary embodiments of the present disclosure, the control device may change the frequency of the audio device based on the alternative frequency, in response that the stored reference data and the fifth broadcast signal are verified as broadcast signals of the same radio broadcast.

According to various exemplary embodiments of the present disclosure, the control device may obtain information related to the alternative frequency from an inside of the audio system or an outside of the audio system.

According to various exemplary embodiments of the present disclosure, the control device may verify the second radio frequency based on a comparison between a first feature extracted from the first broadcast signal and a second feature extracted from the second broadcast signal.

According to various exemplary embodiments of the present disclosure, the control device may verify the third radio frequency based on a comparison between a first feature extracted from the first broadcast signal and a third feature extracted from the third broadcast signal.

According to another aspect of the present disclosure, an operation method of an audio system may include setting a frequency of an audio device included in the audio system to a first radio frequency corresponding to a selected radio broadcast and receiving a first broadcast signal, receiving a second broadcast signal for an alternative frequency associated with the first broadcast signal with receive sensitivity of predetermined first reference sensitivity or more than the predetermined first reference sensitivity, while the first broadcast signal is received through the audio device, and verifying and storing a second radio frequency for transmitting a same broadcast as a radio broadcast of the first radio frequency based on a comparison between the first broadcast signal and the second broadcast signal, receiving a third broadcast signal for the alternative frequency, in response that the first broadcast signal with receive sensitivity less than the predetermined first reference sensitivity, but greater than or equal to predetermined reference sensitivity is received, and changing the frequency of the audio device from the first radio frequency to a third radio frequency corresponding to the alternative frequency based a comparison between the first broadcast signal and the third broadcast signal, and changing the frequency of the audio device based on the second radio frequency, in response that the first broadcast signal with receive sensitivity less than the predetermined second reference sensitivity is received.

According to various exemplary embodiments of the present disclosure, the audio device may include a main tuner and a sub-tuner. The operation method may further include receiving the second broadcast signal and the third broadcast signal through the sub-tuner of the audio device and changing a frequency of the main tuner of the audio device.

According to various exemplary embodiments of the present disclosure, the operation method may further include storing a plurality of second radio frequencies, while the first broadcast signal with the receive sensitivity greater than or equal to the predetermined first reference sensitivity is received, and obtaining at least one of location information or time information and changing the frequency of the audio device to a fourth radio frequency corresponding to the at least one of the location information or the time information among the second radio frequencies, in response that the first broadcast signal with the receive sensitivity less than the predetermined second reference sensitivity is received.

According to various exemplary embodiments of the present disclosure, the operation method may further include changing the frequency of the audio device from the first radio frequency to the third radio frequency, in response that receive sensitivity of the third broadcast signal is better than the receive sensitivity of the first broadcast signal, and controlling a predetermined operation of the audio device, in response that the receive sensitivity of the first broadcast signal is better than the receive sensitivity of the third broadcast signal. The predetermined operation of the audio device may include at least one of an operation of receiving a radio broadcast different from the selected radio broadcast, an operation of stopping receiving the radio broadcast, or an operation of playing a sound source stored in a storage medium.

According to various exemplary embodiments of the present disclosure, the operation method may further include changing the frequency of the audio device from the first radio frequency to the third radio frequency, in response that the first broadcast signal and the third broadcast signal are verified as broadcast signals of the same radio broadcast based on the comparison, and controlling a predetermined operation of the audio device, in response that the first broadcast signal and the third broadcast signal are verified as broadcast signals of different radio broadcasts based on the comparison. The predetermined operation of the audio device may include at least one of an operation of receiving a radio broadcast different from the selected radio broadcast, an operation of stopping receiving the radio broadcast, or an operation of playing a sound source stored in a storage medium.

According to various exemplary embodiments of the present disclosure, the operation method may further include storing at least a portion of the first broadcast signal as reference data, while the first broadcast signal with the receive sensitivity less than the predetermined first reference sensitivity, but greater than or equal to the predetermined second reference sensitivity is received, and receiving a fifth broadcast signal for the alternative frequency, in response that the first broadcast signal with the receive sensitivity less than the predetermined second reference sensitivity is received, and changing the frequency of the audio device based on the second radio frequency, in response that the stored reference data and the fifth broadcast signal are verified as broadcast signals of different radio broadcasts.

According to various exemplary embodiments of the present disclosure, the operation method may further include changing the frequency of the audio device based on the alternative frequency, in response that the stored reference data and the fifth broadcast signal are verified as broadcast signals of the same radio broadcast.

According to various exemplary embodiments of the present disclosure, the operation method may further include obtaining information related to the alternative frequency from an inside of the audio system or an outside of the audio system.

According to various exemplary embodiments of the present disclosure, the operation method may further include verifying the second radio frequency based on a comparison between a first feature extracted from the first broadcast signal and a second feature extracted from the second broadcast signal.

According to various exemplary embodiments of the present disclosure, the operation method may further include verifying the third radio frequency based on a comparison between a first feature extracted from the first broadcast signal and a third feature extracted from the third broadcast signal.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1A:
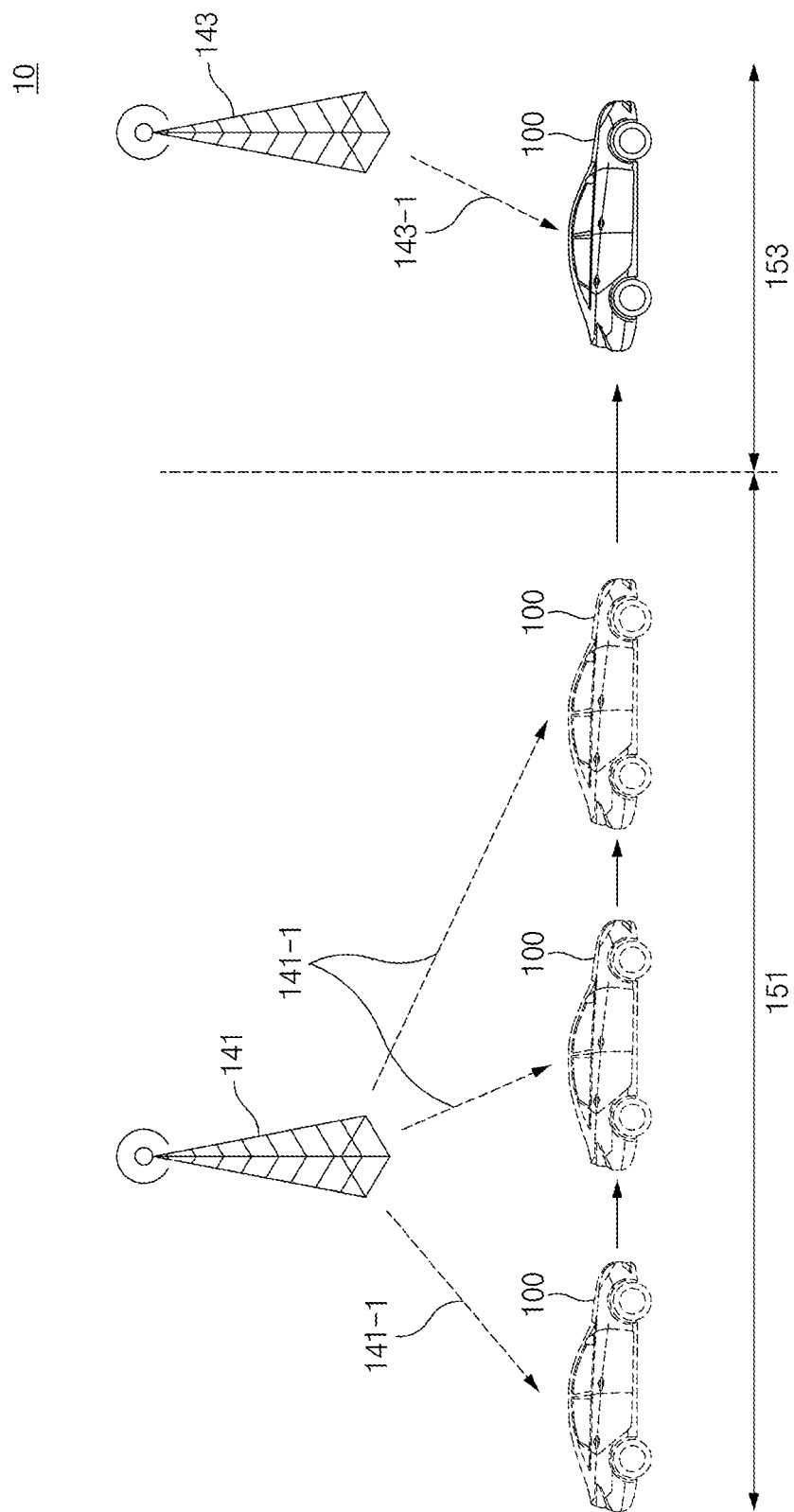
FIG. 1A is a drawing illustrating a vehicle system according to various embodiments.

With regard to description of drawings, the same or similar denotations may be used for the same or similar components.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the exemplary drawings. In the drawings, the same reference numerals will be used throughout to designate the same or equivalent elements. Furthermore, a detailed description of well-known features or functions will be ruled out in order not to unnecessarily obscure the gist of the present disclosure.

In describing the components of the exemplary embodiment of the present disclosure, terms such as first, second, "A", "B", (a), (b), and the like may be used. These terms are only used to distinguish one element from another element, but do not limit the corresponding elements irrespective of the order or priority of the corresponding elements. Furthermore, unless otherwise defined, all terms including technical and scientific terms used herein are to be interpreted as is customary in the art to which the present disclosure belongs. It will be understood that terms used herein should be interpreted as including a meaning which is consistent with their meaning in the context of the present disclosure and the relevant art and will not be interpreted in an idealized or overly formal sense unless so defined herein.

A vehicle described below may refer to a vehicle operated by the riding and/or manipulation of a driver and an autonomous vehicle including a function capable of allowing the vehicle to drive on its own without the manipulation of the driver. Furthermore, a vehicle will be referred to as one example of a vehicle in the description below, and the present disclosure is not limited thereto. For example, various embodiments below are applicable to various means of transportation such as a ship, an airplane, a train, a motorcycle, or a bicycle.

Hereinafter, various embodiments of the present disclosure will be described in detail with reference to FIGS. 1A to 10.

FIG. 1A is a drawing illustrating a vehicle system according to various embodiments.

Referring to FIG. 1A, a vehicle system 10 according to various embodiments of the present disclosure may include a vehicle 100, a first transmission station 141, and a second transmission station 143. However, this is merely illustrative, and various exemplary embodiments of the present disclosure are not limited thereto. For example, at least one of the components of the vehicle system 10, which are described above, may be omitted or one or more other components may be added to the configuration of the vehicle system 10. Furthermore, at least one of the components of the vehicle system 10, which are described above, may be integrated with another component.

According to various exemplary embodiments of the present disclosure, the vehicle 100 may be driven by power generated by a driving device (e.g., an engine, a motor, or the like). According to an exemplary embodiment of the present disclosure, the vehicle 100 may be an eco-friendly vehicle which utilizes power energy stored in a battery module as a power source, but various embodiments below are not limited thereto.

According to various exemplary embodiments of the present disclosure, the vehicle 100 may search for a radio frequency corresponding to a radio broadcast (e.g., a radio program) capable of being received and may receive a broadcast signal of the found radio frequency.

According to an exemplary embodiment of the present disclosure, while driving in a first area 151, the vehicle 100 may receive a first broadcast signal 141-1 transmitted from the first transmission station 141, through the radio frequency (e.g., 300.1 MHz) corresponding to the selected radio broadcast (e.g., a traffic broadcast). Furthermore, the vehicle 100 may output a sound signal corresponding to the received first broadcast signal 141-1 through its speaker. Thus, a passenger (e.g., a driver and another passenger) of the vehicle 100 may listen to the selected radio broadcast.

According to an exemplary embodiment of the present disclosure, when the vehicle 100 moves from the first area 151 to a second area 153, receive sensitivity for the first broadcast signal 141-1 of the radio frequency (e.g., 300.1 MHz) set in the first area 151 may be weakened to a certain level or less.

In this regard, the vehicle 100 may verify an alternative frequency (e.g., 400 MHz) in an adjacent to area which transmits the same radio broadcast as the currently received radio broadcast (e.g., the traffic broadcast) and may switch the set radio frequency (e.g., 300.1 MHz) to the alternative frequency (e.g., 400 MHz) to receive a second broadcast signal 143-1 transmitted from the second transmission station 143. Thus, the passenger of the vehicle 100 may constantly listen to the selected radio broadcast (e.g., the traffic broadcast).

According to an exemplary embodiment of the present disclosure, before switching the set radio frequency to the alternative frequency, the vehicle 100 may compare and analyze the first broadcast signal 141-1 received through the currently received radio frequency (e.g., 300.1 MHz) and the second broadcast signal 143-1 received through the alternative frequency (e.g., 400 MHz) to identify whether the first broadcast signal 141-1 and the second broadcast signal 143-1 are broadcast signals of the same radio broadcast or broadcast signals of different radio broadcasts and may switch the set radio frequency to the alternative frequency when the first broadcast signal 141-1 and the second broadcast signal 143-1 are identified as the broadcast signals of the same radio broadcast. For example, the vehicle 100 may extract a unique feature (e.g., a speaker, background noise, or the like) from each of the first broadcast signal 141-1 and the second broadcast signal 143-1 and may identify whether the two broadcast signals are the broadcast signals of the same radio broadcast based on the extracted unique feature.

However, it may be difficult to extract a unique feature from the first broadcast signal 141-1 in which noise increases to a certain level or more, in a situation wherein the first broadcast signal 141-1 which includes the quality of a certain level or less as the vehicle 100 enters a shadow area (e.g., a tunnel) or the like is received. This may be a factor which degrades the accuracy of identifying whether the first broadcast signal 141-1 and the second broadcast signal 143-1 are the broadcast signals of the same broadcast.

In this regard, various embodiments may automatically switch to another radio frequency for transmitting the same radio broadcast as the currently received radio broadcast even in the situation where the radio broadcast which includes the quality of the certain level or less as the vehicle enters the shadow area or the like is received and may constantly provide a passenger with a radio service. In this regard, a description will be provided in detail with reference to an exemplary embodiment below.

Figure 1B:
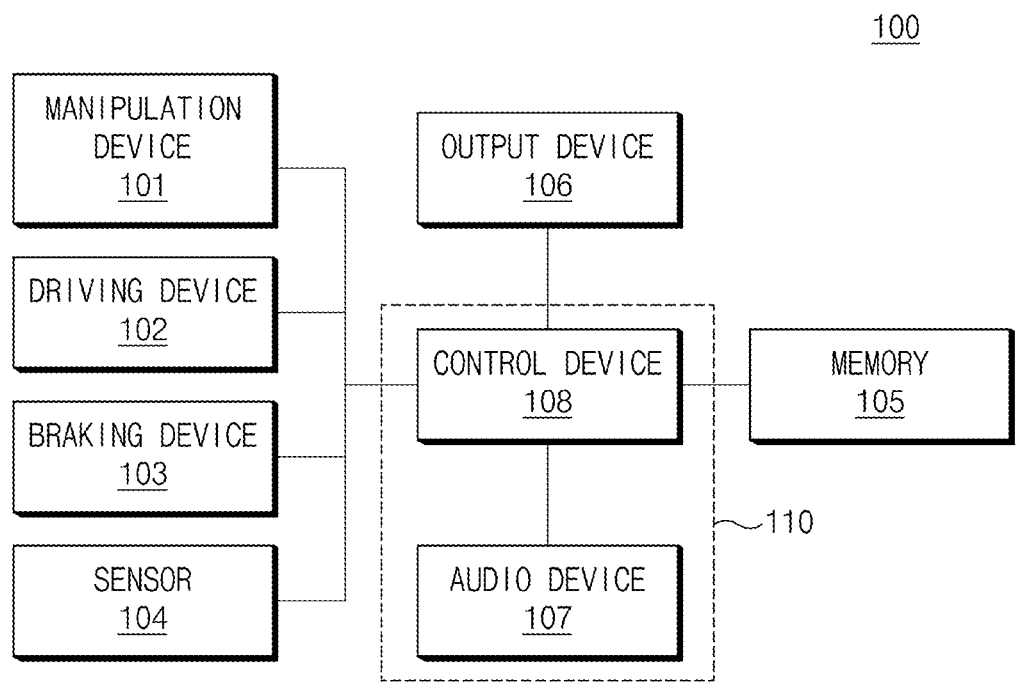
FIG. 1B is a drawing illustrating a vehicle according to various embodiments.

FIG. 1B is a drawing illustrating a vehicle according to various embodiments.

Referring to FIG. 1B, a vehicle 100 according to various embodiments of the present disclosure may include a manipulation device 101, a driving device 102, a braking device 103, a sensor 104, a memory 105, an output device 106, an audio device 107, and a control device 108.

However, this is merely illustrative, and various exemplary embodiments of the present disclosure are not limited thereto. For example, at least one of the components of the vehicle 100, which are described above, may be omitted or one or more other components may be added to the configuration of the vehicle 100. Furthermore, at least one of the components of the vehicle 100, which are described above, may be integrated with another component.

According to an exemplary embodiment of the present disclosure, the manipulation device 101 may receive a user input for driving. According to an exemplary embodiment of the present disclosure, the manipulation device 101 may include a steering input device (e.g., a steering wheel), an acceleration input device (e.g., an accelerator pedal), and a brake input device (e.g., a brake pedal). According to another exemplary embodiment of the present disclosure, the manipulation device 101 may include at least one input device for radio manipulation.

However, this is merely illustrative, and the present disclosure is not limited thereto. For example, various input devices for manipulating a seat heating wire, an internal light, navigation, a turn signal, a tail lamp, a headlamp, wipers, an air conditioner and furnace, and the like loaded into the vehicle 100 may be configured as at least a portion of the manipulation device 101.

According to various exemplary embodiments of the present disclosure, the driving device 102 may be configured to generate a power source associated with driving of the vehicle. According to an exemplary embodiment of the present disclosure, the driving device 102 may include an engine and/or a motor.

For example, power generated by the driving device 102 may be transferred to an axle through a transmission and a differential gear device. Thus, as drive wheels rotate by the axle, the vehicle 100 may drive. As the transmission, the differential gear device, the axle, and the drive wheel are well known in many documents, a detailed description thereof will be omitted in an exemplary embodiment of the present disclosure.

According to various exemplary embodiments of the present disclosure, the braking device 103 may perform control of a brake apparatus in the vehicle 100. According to an exemplary embodiment of the present disclosure, the braking device 103 may be configured for controlling operations of brakes respectively provided on a plurality of drive wheels to adjust a speed (e.g., deceleration) of the vehicle 100.

According to various exemplary embodiments of the present disclosure, the sensor 104 may detect a state of the vehicle 100 and may be configured to generate an electrical signal or a data value corresponding to the detected state. According to embodiment embodiments, the sensor 104 may include at least one sensor configured to collect (or detect) information associated with a driving state of the vehicle 100. The information associated with the driving state of the vehicle 100 may include at least one of a driving speed, a current weight, a braking state, a steering state, an acceleration state, or a deceleration state of the vehicle 100.

However, this is merely illustrative, and various exemplary embodiments of the present disclosure are not limited thereto. Furthermore, the sensor 104 may include various types of sensors (e.g., radio detection and ranging (RADAR), light detection and ranging (LiDAR), a camera, an ultrasonic sensor, a laser scanner, and the like) configured for detecting an obstacle located around the vehicle 100 and obtaining information related to a distance from the obstacle, a relative speed of the obstacle, and/or or a type of the obstacle (e.g., another vehicle, a pedestrian, a bicycle, a motorcycle, or the like). Furthermore, various sensors configured to detect a state of a passenger may be provided as the configuration of the sensor 104.

According to various exemplary embodiments of the present disclosure, the memory 105 may include data associated with at least one other components of the vehicle 100 and a program, an algorithm, a routine, and/or an instruction associated with an operation (or control) of the vehicle 100.

For example, the memory 105 may include at least one type of storage medium, such as a flash memory type memory, a hard disk type memory, a micro type memory, a card type memory (e.g., a secure digital (SD) card or an extreme digital (XD) card), a random access memory (RAM), a static RAM (SRAM), a read-only memory (ROM), a programmable ROM (PROM), an electrically erasable PROM (EEPROM), a magnetic RAM (MRAM), a magnetic disk, or an optical disk.

According to various exemplary embodiments of the present disclosure, the output device 106 may output information associated with an operation of the vehicle 100. According to an exemplary embodiment of the present disclosure, the output device 106 may include a sound output device (e.g., a speaker) configured to output audible information. Additionally, the output device 106 may include a display (e.g., a head-up display, a touch screen, a cluster, or the like) configured to output visual information, a haptic module (e.g., a motor, a piezoelectric element, an electrical stimulation device, or the like) configured to output tactile information, or the like.

According to an exemplary embodiment of the present disclosure, the audio device 107 may support a function of playing a sound source stored in the vehicle 100 (e.g., the memory 105) or another storage medium (e.g., a compact disc).

Additionally or alternatively, the audio device 107 may receive a broadcast signal over the air. For example, the audio device 107 may search for a radio frequency corresponding to a radio broadcast (e.g., a radio program) capable of being received and may receive a broadcast signal of the found radio frequency. A detailed description of the audio device 107 associated with it will be provided below with reference to FIG. 2.

According to various exemplary embodiments of the present disclosure, the control device 108 may be electrically connected to the manipulation device 101, the driving device 102, the braking device 103, the sensor 104, the memory 105, the output device 106, and the audio device 107 and may be configured for controlling the overall operation of the vehicle 100. For example, the control device 108 may be an electronic control unit (ECU), a micro controller unit (MCU), or another sub-controller, which is loaded into the vehicle 100.

According to various exemplary embodiments of the present disclosure, the vehicle 100 may include an audio system 110 which is configured to control power of a radio broadcast. For example, the audio system 110 may include the audio device 107 and the control device 108. This is illustrative, and another component (e.g., the output device 106) of the vehicle 100 may be further added to the configuration of the audio system 110.

A description below is associated with various embodiments of the audio system 110.

According to an exemplary embodiment of the present disclosure, the control device 108 may be configured for controlling power of the radio broadcast. For example, the control device 108 may be configured for controlling the audio device 107 to set (e.g., select) a first radio frequency (e.g., 300.1 MHz) corresponding to a radio broadcast (e.g., a radio program "traffic broadcast") selected by the manipulation device 101 (e.g., an input device) and receive a first broadcast signal of the set first radio frequency. Furthermore, the control device 108 may be configured for controlling the output device 106 (e.g., a sound output device) to output a sound signal corresponding to the first broadcast signal received through the audio device 107.

According to various exemplary embodiments of the present disclosure, while the first broadcast signal is received, the control device 108 may measure receive sensitivity for the first broadcast signal. For example, the receive sensitivity may be associated with quality of the first broadcast signal received through the audio device 107, for example, received signal strength indication or a signal to noise ratio.

According to various exemplary embodiments of the present disclosure, the control device 108 may compare the measured receive sensitivity with predetermined reference sensitivity. The predetermined reference sensitivity may include first reference sensitivity, second reference sensitivity, and third reference sensitivity.

According to an exemplary embodiment of the present disclosure, the first reference sensitivity may be signal sensitivity which is a criterion for determining whether to maintain the reception of the radio broadcast (e.g., the first broadcast signal) through the first radio frequency or whether to stop receiving the current radio broadcast through the first radio frequency and switch to another frequency (e.g., 400 MHz) for transmitting the same radio broadcast. Furthermore, the second reference sensitivity may be signal sensitivity which is a criterion for determining a situation where it is possible to extract a unique feature (e.g., a speaker, background noise, or the like) from the radio broadcast currently received through the first radio frequency. The third reference sensitivity may be signal sensitivity which is a criterion for determining a situation where it is impossible to extract a unique feature from the radio broadcast currently received through the first radio frequency. For example, the second reference sensitivity may include a value less than the first reference sensitivity, and the third reference sensitivity may include a value less than the second reference sensitivity.

For example, the case where the receive sensitivity is greater than or equal to the first receive sensitivity may be a situation where an electric field state is good enough to maintain the current reception of the radio broadcast through the first radio frequency. Furthermore, the case where the receive sensitivity is less than the first reference sensitivity, but is greater than or equal to second reference sensitivity may be a situation where it is difficult to maintain the current reception of the radio broadcast through the first radio frequency, but where it is possible to analyze the radio broadcast currently received through the first radio frequency (e.g., a situation where the electric field state is bad). The case where the receive sensitivity is less than third reference sensitivity may be a situation where it is difficult to maintain the current reception of the radio broadcast through the first radio frequency and where it is impossible to analyze the radio broadcast currently received through the first radio frequency (e.g., a situation where the electric field state is very bad).

According to various exemplary embodiments of the present disclosure, when the receive sensitivity for the first broadcast signal is greater than or equal to the first reference sensitivity, the control device 108 may maintain the reception of the first broadcast signal through the first radio frequency. Furthermore, the control device 108 may perform a first correlation determination operation while maintaining the reception of the first broadcast signal through the first radio frequency. The first correlation determination operation may be an operation of determining a correlation indicating a degree to which a radio broadcast corresponding to the first broadcast signal received in the situation where the receive sensitivity is greater than or equal to the first reference sensitivity and a radio broadcast corresponding to a second broadcast signal received through a second radio frequency are identical to each other.

For example, the control device 108 may perform the first correlation determination operation of verifying the second radio frequency in an adjacent to area which transmits the same radio broadcast as the currently received radio broadcast, in a situation where the first reference sensitivity is met, and analyzing the currently received radio broadcast and the radio broadcast of the second radio frequency to determine a correlation between the two radio broadcasts. In this regard, the control device 108 may obtain information associated with the second radio frequency from the outside of the vehicle 100 (e.g., a transmission station 141 or 143) or may obtain information associated with the second radio frequency from the inside (e.g., the memory 105) of the vehicle 100.

For example, the control device 108 may analyze the radio broadcasts to extract a unique feature (e.g., a speaker, background noise, or the like) from each of the radio broadcasts and may assign a correlation indicating the two radio broadcasts are the same broadcast when the same unique feature is extracted from the two radio broadcasts. However, this is merely illustrative, and various exemplary embodiments of the present disclosure are not limited thereto. For example, various well-known technologies may be applied in determining the correlation between the radio broadcasts. Furthermore, the control device 108 may periodically or continuously determine a correlation for a radio broadcast. As an exemplary embodiment of the present disclosure, the correlation for the radio broadcast may be stored in conjunction with the second broadcast signal. Additionally or alternatively, the correlation determined by the first correlation determination operation may be stored in conjunction with a location where the first correlation determination operation is performed and a time when the first correlation determination operation is performed.

According to various exemplary embodiments of the present disclosure, when the receive sensitivity for the first broadcast signal is less than the first reference sensitivity, but is greater than or equal to the second reference sensitivity, the control device 108 may perform processing to receive the same broadcast as the currently received radio broadcast through a third radio frequency. For example, the control device 108 may verify the third radio frequency in an adjacent to area which transmits the same broadcast as the radio broadcast currently received through the first radio frequency and may switch the current set first radio frequency to the third radio frequency when a third broadcast signal of the third radio frequency is better in quality than the currently received first broadcast signal. For example, the third radio frequency may be the same as or different from the second radio frequency obtained in the first correlation determination operation.

In this regard, before switching the first radio frequency to the third radio frequency, the control device 108 may perform a second correlation determination operation. The second correlation determination operation may be an operation of determining a correlation indicating a degree to which a radio broadcast of the first radio frequency received in the situation where the receive sensitivity is less than the first reference sensitivity, but is greater than or equal to the second reference sensitivity and a radio broadcast of the third radio frequency are identical to each other. In other words, when the two radio broadcasts are identified as the same broadcast by the second correlation determination operation, the control device 108 may switch the first radio frequency to the third radio frequency to prevent the radio broadcast of the first radio frequency from switching to a different radio broadcast.

According to various exemplary embodiments of the present disclosure, when the receive sensitivity for the broadcast signal is less than the third reference sensitivity, the control device 108 may select a fourth radio frequency based on the result of performing the first correlation determination operation which is already performed and may switch the first radio frequency to the selected fourth radio frequency. For example, the fourth radio frequency may be one of the second radio frequencies obtained in the first correlation determination operation. For example, one second radio frequency corresponding to a current location of the vehicle 100 among the second radio frequencies may be selected as the fourth radio frequency.

In other words, noise of a certain level or more may be included in a radio broadcast received in the situation where the receive sensitivity for the broadcast signal is less than the third reference sensitivity. Thus, the control device 108 may select a second radio frequency using the result of performing the first correlation determination operation (e.g., the result of determining the correlation) performed in a situation where noise is not included in radio broadcast, without performing an additional correlation determination operation for the radio broadcast in which the noise of the certain level or more is included.

Figure 2:
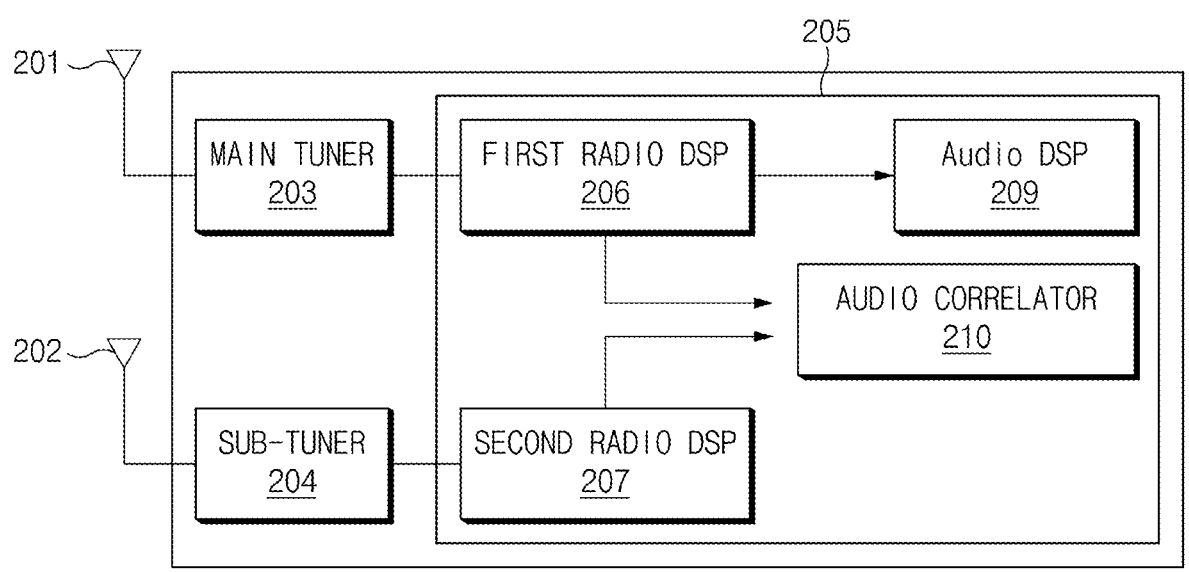
FIG. 2 is a drawing schematically illustrating a configuration of an audio device according to various embodiments.

FIG. 2 is a drawing schematically illustrating a configuration of an audio device according to various embodiments.

Referring to FIG. 2, an audio device 107 may include a first antenna 201, a second antenna 202, a main tuner 203 electrically connected to the first antenna 201, a sub-tuner 204 electrically connected to the second antenna 202, and/or a signal processing device 205.

According to various exemplary embodiments of the present disclosure, the first antenna 201 and the second antenna 202 may receive a signal transmitted from a transmission station of each radio station.

According to various exemplary embodiments of the present disclosure, the main tuner 203 may receive a signal of a radio frequency corresponding to the selected radio broadcast (or the radio program), and the sub-tuner 204 may receive a signal of at least one radio frequency settable in the audio device 107.

According to an exemplary embodiment of the present disclosure, the sub-tuner 204 may identify at least one radio frequency settable in the audio device 107, that is, a valid radio frequency, based on electric field strength of signals of all frequencies received through the second antenna, 202. For example, the sub-tuner 204 may identify a radio frequency of a signal of electric field strength greater than predetermined reference electric field strength as a valid radio frequency.

According to various exemplary embodiments of the present disclosure, the signal processing device 205 may perform signal processing of the signal delivered from the main tuner 203 and/or the sub-tuner 204 and may deliver the signal-processed information to a control device 108. According to an exemplary embodiment of the present disclosure, the signal processing device 205 may output a sound signal corresponding to the signal of the radio frequency received from the main tuner 203 through an output device 106, based on control of the control device 108.

According to various exemplary embodiments of the present disclosure, the signal processing device 205 may include a first radio digital signal processor (DSP) 206 electrically connected to the main tuner 203, a second radio DSP 207 electrically connected to the sub-tuner 204, an audio correlator 208, and/or an audio DSP 209.

According to various exemplary embodiments of the present disclosure, the first radio DSP 206 may perform signal processing of the signal received from the main tuner 203 and may deliver the received signal to the audio correlator 208 and/or the audio DSP 209, and the second radio DSP 207 may perform signal processing of the signal received from the sub-tuner 204 and may deliver the received signal to the audio correlator 208.

According to various exemplary embodiments of the present disclosure, the audio correlator 208 may be configured to determine a correlation between the signal delivered from the first radio DSP 206 and the signal delivered from the second radio DSP 207 and may deliver correlation information to the control device 108. For example, the correlation information may be used to change a radio frequency.

According to various exemplary embodiments of the present disclosure, the audio DSP 209 may perform signal processing of the signal delivered from the first DSP 206 and may deliver the delivered signal to the output device 106 of a vehicle 100.

The above-mentioned components of the audio device 107 are an exemplary embodiment of the present disclosure, and various exemplary embodiments of the present disclosure are not limited thereto. For example, at least one of the components of the audio device 107, which are described above, may be omitted or one or more other components may be added to the configuration of the audio device 107. For example, the sub-tuner 204 may be omitted from the configuration of the audio device 107, and the operations executed by the sub-tuner 204 may be executed by the main tuner 203.

As described above, the audio system 110 according to various embodiments of the present disclosure may analyze a radio broadcast of a first radio frequency currently received in a situation where the electric field state is good and a radio broadcast of a second radio frequency to determine a first correlation between the two radio broadcasts and may select the second radio frequency in an adjacent to area which transmits the same broadcast as the currently received radio broadcast using the previously determined first correlation in a situation where the electric field state is very bad, thus continuously outputting the same radio broadcast as the currently received radio broadcast although the electric field state is rapidly degraded.

Hereinafter, a description will be provided below of an operation method of the audio system 110 according to various embodiments with reference to FIG. 3, FIG. 4, and FIG. 5.

Figure 3:
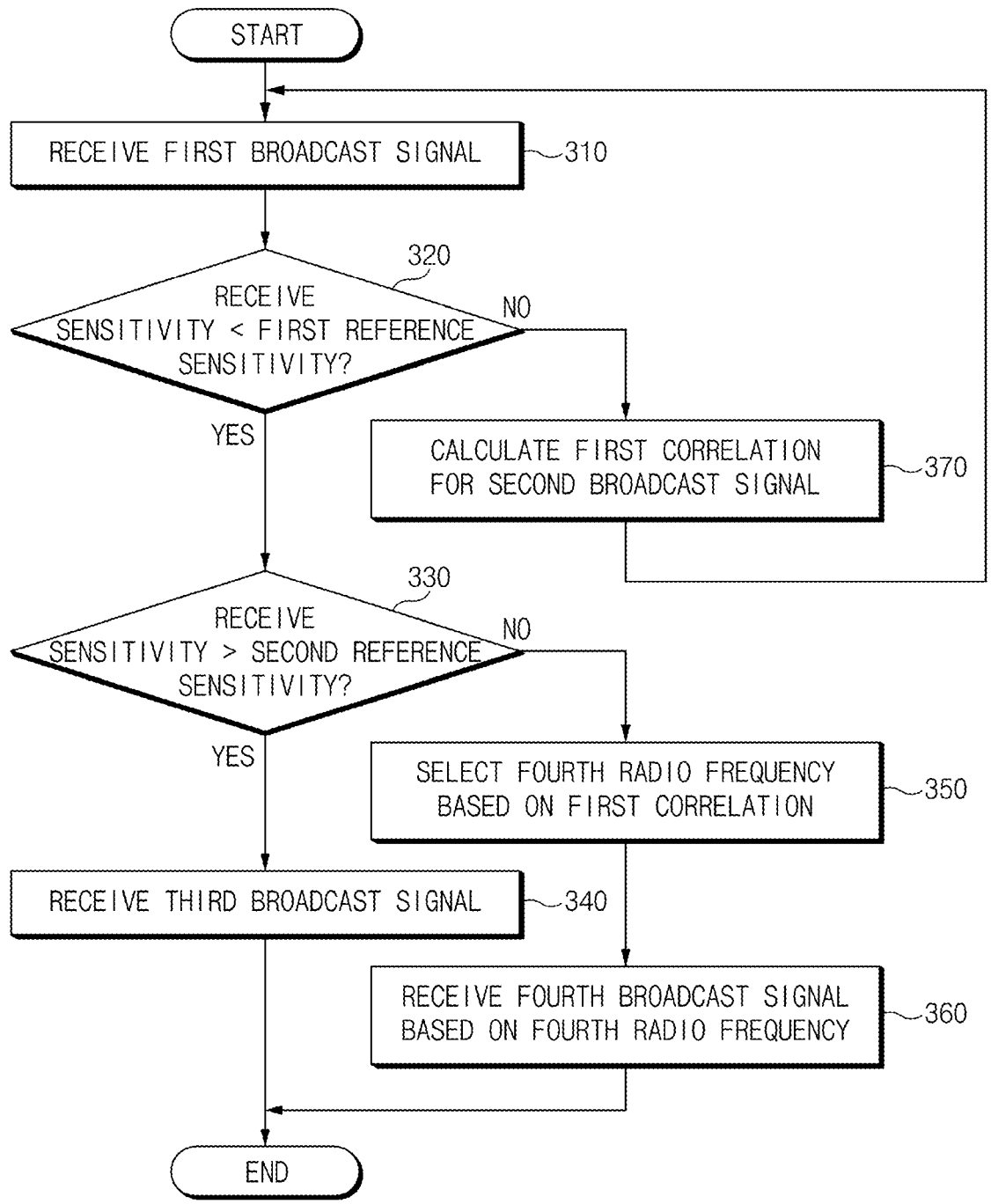
FIG. 3 is a flowchart for describing an operation of an audio system according to various embodiments.

FIG. 3 is a flowchart for describing an operation of an audio system according to various embodiments. Respective operations in an exemplary embodiment below may be sequentially performed, but are not necessarily sequentially performed. For example, an order of the respective operations may be changed, and at least two operations may be performed in parallel. Furthermore, at least one of operations below may be omitted according to an exemplary embodiment of the present disclosure.

Referring to FIG. 3, in operation 310, an audio system 110 (e.g., a control device 108) according to various embodiments of the present disclosure may receive a first broadcast signal. According to an exemplary embodiment of the present disclosure, the control device 108 may search for a first radio frequency (e.g., 300.1 MHz) corresponding to a radio broadcast (e.g., a radio program "traffic broadcast") and may receive a first broadcast signal of the found first radio frequency. For example, the control device 108 may receive the first broadcast signal through a main tuner 203.

According to various exemplary embodiments of the present disclosure, in operation 320, the audio system 110 (e.g., the control device 108) may measure receive sensitivity for the first broadcast signal and may compare the receive sensitivity with specified reference sensitivity. According to an exemplary embodiment of the present disclosure, the control device 108 may be configured to determine whether receive sensitivity less than first reference sensitivity is measured. For example, the first reference sensitivity may be signal sensitivity which is a criterion for determining whether to maintain the reception of the first broadcast signal through the first radio frequency or whether to stop receiving the first broadcast signal through the first radio frequency and switching to another radio frequency (e.g., 400 MHz) for transmitting the same radio broadcast through the first radio frequency. The other radio frequency may be an alternative frequency for broadcasting the same radio broadcast.

According to various exemplary embodiments of the present disclosure, when the receive sensitivity of the first reference sensitivity or more than the first reference sensitivity is measured, in operation 370, the audio system 110 (e.g., the control device 108) may perform a first correlation determination operation while maintaining the reception of the first broadcast signal through the first radio frequency.

According to an exemplary embodiment of the present disclosure, the first correlation determination operation may be an operation of determining a correlation for a second broadcast signal of a second radio frequency for transmitting the same radio broadcast as the first broadcast signal received in the situation where the receive sensitivity is greater than or equal to the first reference sensitivity. For example, the correlation may be an index indicating a degree to which a radio broadcast corresponding to the first broadcast signal and a radio broadcast corresponding to the second broadcast signal are the identical to each other.

For example, as will be described below with reference to FIG. 5, the control device 108 may obtain the second radio frequency associated with the currently received radio broadcast, in a situation where the first reference sensitivity is met, and may receive the second broadcast signal of the second radio frequency through the sub-tuner 204 to use the second broadcast signal to determine a correlation. Furthermore, the control device 108 may periodically or continuously obtain a plurality of second radio frequencies and may select only the second radio frequency with a correlation of a certain level or more among the plurality of second radio frequencies to obtain (and/or store) the selected second radio frequency as first correlation information.

According to various exemplary embodiments of the present disclosure, when the receive sensitivity less than the first reference sensitivity is measured, in operation 330, the audio system 110 (e.g., the control device 108) may be configured to determine whether the receive sensitivity for the first broadcast signal is greater than or equal to second reference sensitivity. According to an exemplary embodiment of the present disclosure, the control device 108 may be configured to determine whether the receive sensitivity is less than the first reference sensitivity and is greater than or equal to the second reference sensitivity. Furthermore, the second reference sensitivity may be signal sensitivity which is a criterion for determining a situation where it is possible to extract a unique feature (e.g., a speaker, background noise, or the like) from the radio broadcast currently received through the first radio frequency.

According to various exemplary embodiments of the present disclosure, when the receive sensitivity is less than the first reference sensitivity and is greater than or equal to the second reference sensitivity, in operation 330, the audio system 110 (e.g., the control device 108) may obtain a third radio frequency associated with the currently received radio broadcast and may receive a third broadcast signal through a third radio frequency in operation 340. According to an exemplary embodiment of the present disclosure, the third radio frequency may be an alternative frequency for broadcasting the same radio broadcast as the radio broadcast received through the first radio frequency. Such a third radio frequency may be obtained from the outside of the vehicle 100 (e.g., a transmission station 141 or 143) and may be obtained from the inside (e.g., a memory 105) of the vehicle 100, in the situation where the receive sensitivity is less than the first reference sensitivity and is greater than or equal to the second reference sensitivity. For example, the control device 108 may switch a setting frequency of the main tuner 203 from the first radio frequency to the third radio frequency to receive the third broadcast signal. For example, the third radio frequency may be the same as or different from the second radio frequency obtained in the first correlation determination operation.

According to various exemplary embodiments of the present disclosure, when the receive sensitivity is less than the second reference sensitivity, in operation 330, the audio system 110 (e.g., the control device 108) may obtain a fourth radio frequency based on the first correlation information and may receive a fourth radio broadcast in operation 350. According to an exemplary embodiment of the present disclosure, the fourth radio frequency may be one of a plurality of second radio frequencies with a correlation of a certain level or more, which are obtained in the first correlation determination operation. For example, the control device 108 may select the fourth radio frequency among the plurality of second radio frequencies based on a current time and/or a location of a vehicle 100. For example, the control device 108 may switch a setting frequency of the main tuner 203 from the first radio frequency to the fourth radio frequency to receive the fourth broadcast signal. In other words, when the receive sensitivity is less than the second reference sensitivity, the control device 108 may exclude performing a separate correlation determination operation. This may prevent an inaccurate correlation from being determined as noise increases to a certain level or more in the broadcast signal which is less than the second reference sensitivity.

Figure 4:
FIG. 4 is a drawing for describing first correlation information according to various embodiments.

FIG. 4 is a drawing for describing first correlation information according to various embodiments.

Referring to FIG. 4, the first correlation information according to various embodiments of the present disclosure may be at least a portion of the result of performing a first correlation determination operation. For example, the first correlation information may be stored in the inside (e.g., a memory 105) of a vehicle 100 and/or the outside of the vehicle 100 (e.g., a server device).

According to various exemplary embodiments of the present disclosure, the first correlation information may include location information 401, time information 403, listening broadcast information (and/or frequency information) 405, alternative broadcast information (and/or frequency information) 407, and a correlation 409 between a listening broadcast and an alternative broadcast.

According to an exemplary embodiment of the present disclosure, the location information 401 and the time information 403 may be associated with a location where the first correlation determination operation is performed and a time when the first correlation determination operation is performed, respectively.

According to an exemplary embodiment of the present disclosure, the listening broadcast information 405 may be associated with a radio broadcast (e.g., a first broadcast signal of FIG. 3) received through an audio system 110 at a time point when the first correlation determination operation is performed. For example, the listening broadcast information 405 may include identification information (e.g., a radio program name) and frequency information of a radio broadcast.

According to an exemplary embodiment of the present disclosure, the alternative broadcast information 407 may be associated with the same radio broadcast as a listening broadcast or an alternative broadcast (e.g., a second broadcast signal or a third broadcast signal of FIG. 3) transmitted through another radio frequency in an adjacent to area. For example, the alternative broadcast information 407 may include identification information (e.g., a radio program name) and frequency information of an alternative broadcast.

According to an exemplary embodiment of the present disclosure, the correlation may be an index indicating that the listening broadcast and the alternative broadcast are identical to each other. For example, as the correlation is high, there is a possibility that the listening broadcast and the alternative broadcast will be the same broadcast. Furthermore, as the correlation is low, there is a possibility that the listening broadcast and the alternative broadcast will be different broadcasts. As an exemplary embodiment of the present disclosure, the alternative broadcast with a correlation less than a certain level may be excluded from the first correlation information.

Figure 5:
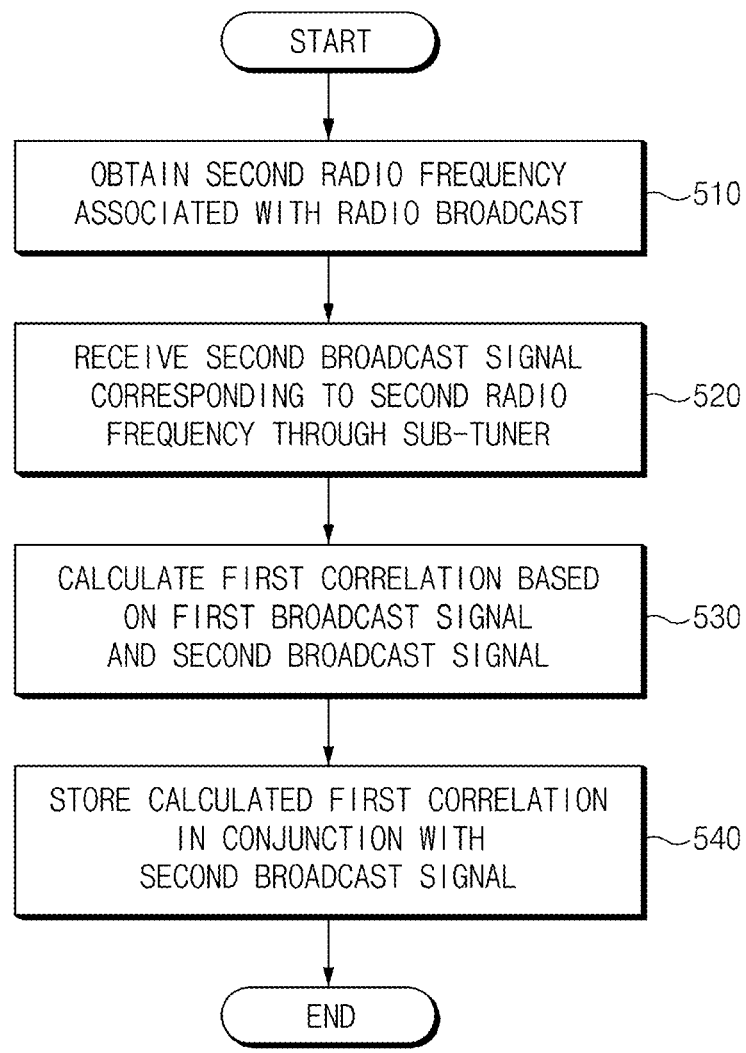
FIG. 5 is a flowchart for describing an operation of determining a first correlation in an audio system according to various embodiments.

FIG. 5 is a flowchart for describing an operation of determining a first correlation in an audio system according to various embodiments. Operations of FIG. 5, which will be described below, may indicate various embodiments for operation 370 of FIG. 3. Furthermore, respective operations in an exemplary embodiment below may be sequentially performed or an order of the respective operations may be changed. Furthermore, at least two of operations below may be performed in parallel, and at least one of the operations below may be omitted according to an exemplary embodiment of the present disclosure.

Referring to FIG. 5, in operation 510, an audio system 110 (e.g., a control device 108) according to various embodiments of the present disclosure may obtain a second radio frequency associated with a radio broadcast (e.g., a first broadcast signal), in a situation where receive sensitivity of a first broadcast signal for a radio broadcast (e.g., a radio program) (e.g., a first broadcast signal received in operation 310 of FIG. 3) is greater than or equal to first reference sensitivity.

According to an exemplary embodiment of the present disclosure, the second radio frequency may be another radio frequency (e.g., an alternative frequency) for transmitting the same radio broadcast as a radio broadcast received through a first radio frequency. For example, the control device 108 may obtain the second radio frequency from the outside of the vehicle 100 (e.g., a first transmission station 141 which receives the first broadcast signal). For another example, the control device 108 may obtain the second radio frequency from the inside (e.g., a memory 105) of the vehicle 100.

According to various exemplary embodiments of the present disclosure, in operation 520, the audio system 110 (e.g., the control device 108) may receive a second broadcast signal corresponding to the second radio frequency through a sub-tuner 204.

According to various exemplary embodiments of the present disclosure, in operation 530, the audio system 110 (e.g., the control device 108) may be configured to determine a first correlation based on the first broadcast signal of the first radio frequency (e.g., the first broadcast signal received through a main tuner 203) and the second broadcast signal of the second radio frequency (e.g., the second broadcast signal received through the sub-tuner 204).

According to an exemplary embodiment of the present disclosure, the control device 108 may extract a unique feature (e.g., a speaker, background noise, or the like) from each of the first broadcast signal and the second broadcast signal and may be configured to determine the first correlation based on the extracted unique feature. For example, when the same unique feature is extracted in a certain level or more from the first broadcast signal and the second broadcast signal, the control device 108 may assign a correlation indicating that the radio broadcasts are the same broadcast.

According to various exemplary embodiments of the present disclosure, in operation 540, the audio system 110 (e.g., the control device 108) may store the determined first correlation in conjunction with the second broadcast signal. According to an exemplary embodiment of the present disclosure, the control device 108 may store the first correlation in the inside (e.g., the memory 105) of the vehicle 100 or the outside of the vehicle 100 (e.g., a server device).

Figure 6:
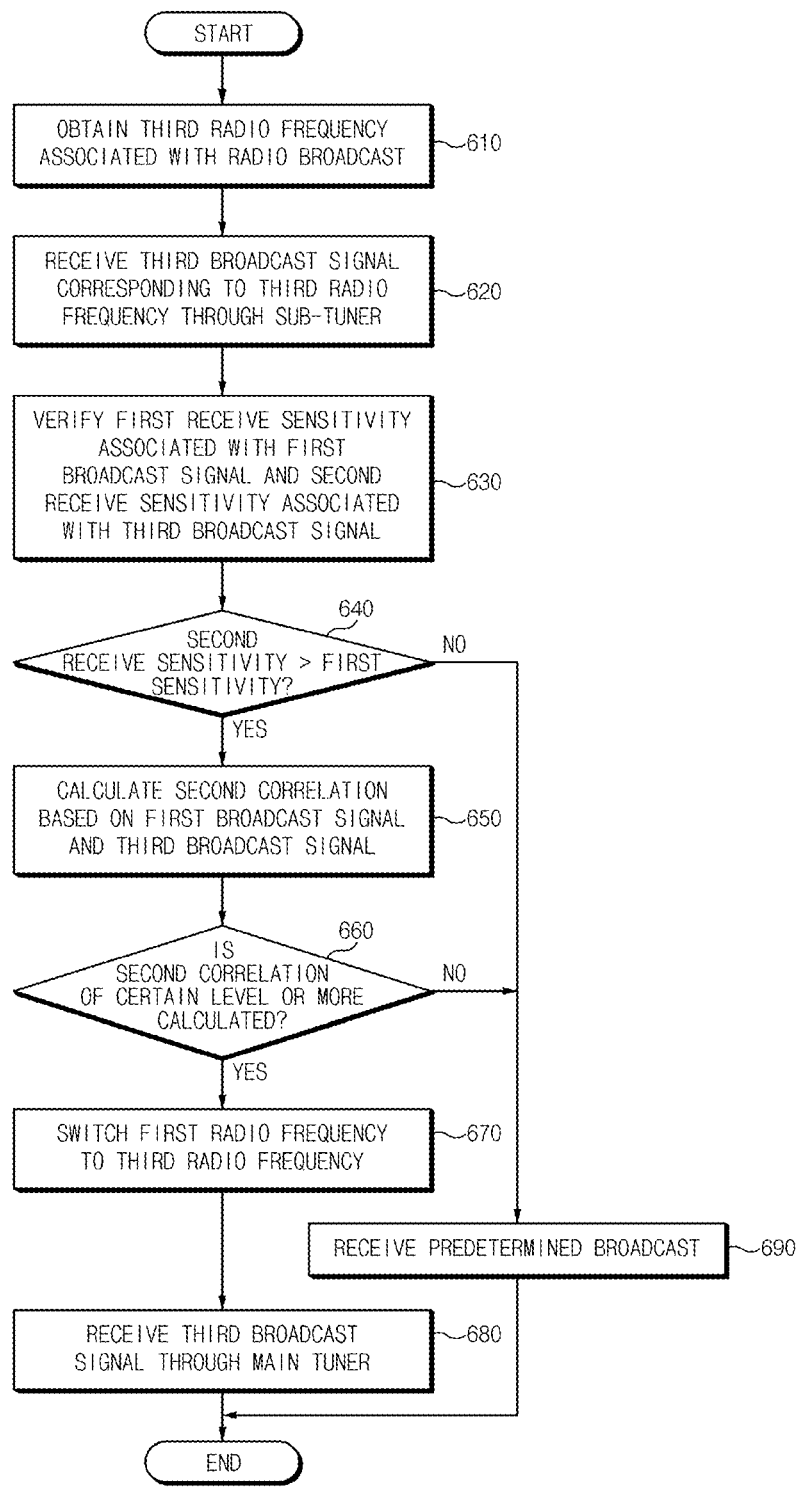
FIG. 6 is a flowchart for describing an operation of receiving a third broadcast signal in an audio system according to various embodiments.

FIG. 6 is a flowchart for describing an operation of receiving a third broadcast signal in an audio system according to various embodiments. Operations of FIG. 6, which will be described below, may indicate various embodiments for operation 340 of FIG. 3. Furthermore, respective operations in an exemplary embodiment below may be sequentially performed or an order of the respective operations may be changed. Furthermore, at least two of operations below may be performed in parallel, and at least one of the operations below may be omitted according to an exemplary embodiment of the present disclosure.

Referring to FIG. 6, in operation 610, an audio system 110 (e.g., a control device 108) according to various embodiments of the present disclosure may obtain a third radio frequency associated with a radio broadcast (e.g., a first broadcast signal), in a situation where receive sensitivity of a first broadcast signal for a radio broadcast (e.g., a radio program) (e.g., the first broadcast signal received in operation 310 of FIG. 3) is less than first reference sensitivity and is greater than or equal to second reference sensitivity. The third radio frequency may be another radio frequency (e.g., an alternative frequency) for transmitting the same radio broadcast as a radio broadcast received through a first radio frequency. For example, the third radio frequency may be the same as or different from a second radio frequency obtained in a first correlation determination operation.

According to various exemplary embodiments of the present disclosure, in operation 620, the audio system 110

(e.g., the control device 108) may receive a third broadcast signal corresponding to the third radio frequency through a sub-tuner 204.

According to various exemplary embodiments of the present disclosure, in operation 630, the audio system 110 (e.g., the control device 108) may verify first receive sensitivity associated with a first broadcast signal of a first radio frequency (e.g., the first broadcast signal received through a main tuner 203) and second receive sensitivity associated with the third broadcast signal of the third radio frequency (e.g., the third broadcast signal received through the sub-tuner 204). As described above, the first receive sensitivity and the second receive sensitivity may be associated with quality of the first broadcast signal and quality of the third broadcast signal, respectively.

According to various exemplary embodiments of the present disclosure, in operation 640, the audio system 110 (e.g., the control device 108) may be configured to determine whether the quality of the third broadcast signal of the third radio frequency is better than the quality of the first broadcast signal of the first radio frequency.

According to various exemplary embodiments of the present disclosure, when the quality of the third broadcast signal is not better than the quality of the first broadcast signal, in operation 690, the audio system 110 (e.g., the control device 108) may receive a predetermined broadcast.

According to an exemplary embodiment of the present disclosure, the control device 108 may be configured to determine that it is difficult to receive a radio broadcast of a certain level or more through the first radio frequency and it is unable to receive the radio broadcast of the certain level or more although the first radio frequency switches to the third radio frequency and may receive and output the predetermined broadcast through an output device 106. For example, the predetermined broadcast may be the first broadcast signal with better quality than the third broadcast signal received through the third radio frequency. As an exemplary embodiment of the present disclosure, the predetermined broadcast may be a radio broadcast (e.g., a news broadcast) different from the currently received broadcast (e.g., a traffic broadcast). In this regard, the control device 108 may receive and output another radio broadcast with quality of a certain level or more. As an exemplary embodiment of the present disclosure, the predetermined broadcast may be associated with a frequency (e.g., a preset frequency) preset in the audio system 110. However, this is merely illustrative, and various exemplary embodiments of the present disclosure are not limited thereto. For example, when the quality of the third broadcast signal is not better than the quality of the first broadcast signal, the control device 108 may perform a function of determining that it is unable to receive the radio broadcast of the certain level or more although the first radio frequency switches to the third radio frequency and stopping receiving the radio broadcast or playing a sound source stored in a storage medium (e.g., a compact disc).

According to various exemplary embodiments of the present disclosure, when the quality of the third broadcast signal is better than the quality of the first broadcast signal, in operation 650, the audio system 110 (e.g., the control device 108) may be configured to determine a second correlation based on the first broadcast signal and the third broadcast signal.

According to an exemplary embodiment of the present disclosure, the control device 108 may extract a unique feature (e.g., a speaker, background noise, or the like) from each of the first broadcast signal and the third broadcast signal and may be configured to determine the second correlation based on the extracted unique feature. For example, when the same unique feature is extracted in a certain level or more from the first broadcast signal and the third broadcast signal, the control device 108 may assign a correlation indicating that the radio broadcasts are the same broadcast.

According to various exemplary embodiments of the present disclosure, in operation 660, the audio system 110 (e.g., the control device 108) may be configured to determine whether the second correlation of a certain level or more is determined. In other words, the control device 108 may be configured to determine whether the same radio broadcast is received through the third radio frequency.

According to various exemplary embodiments of the present disclosure, when the second correlation less than the certain level is determined (e.g., it is determined that the same radio broadcast is not received through the third radio frequency), in operation 690, the audio system 110 (e.g., the control device 108) may receive a predetermined radio broadcast.

According to various exemplary embodiments of the present disclosure, when the second correlation of the certain level or more is determined (e.g., it is determined that the same radio broadcast is received through the third radio frequency), in operations 670 and 680, the audio system 110 (e.g., the control device 108) may switch the first radio frequency to the third radio frequency. For example, the control device 108 may switch a setting frequency of the main tuner 203 from the first radio frequency to the third radio frequency to receive the third broadcast signal.

Figure 7:
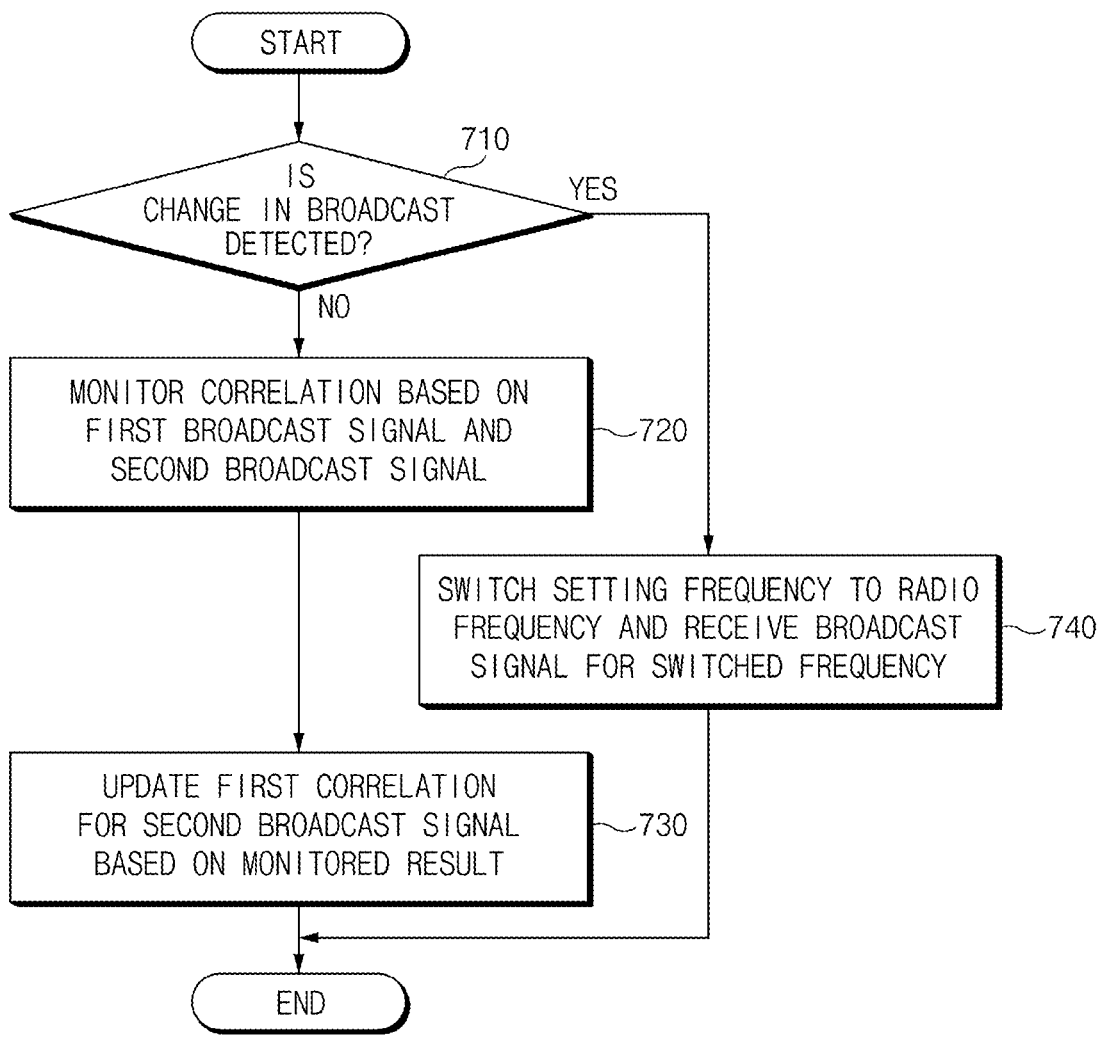
FIG. 7 is a flowchart for describing an operation of storing a first correlation in an audio system according to various embodiments.
Figure 8:
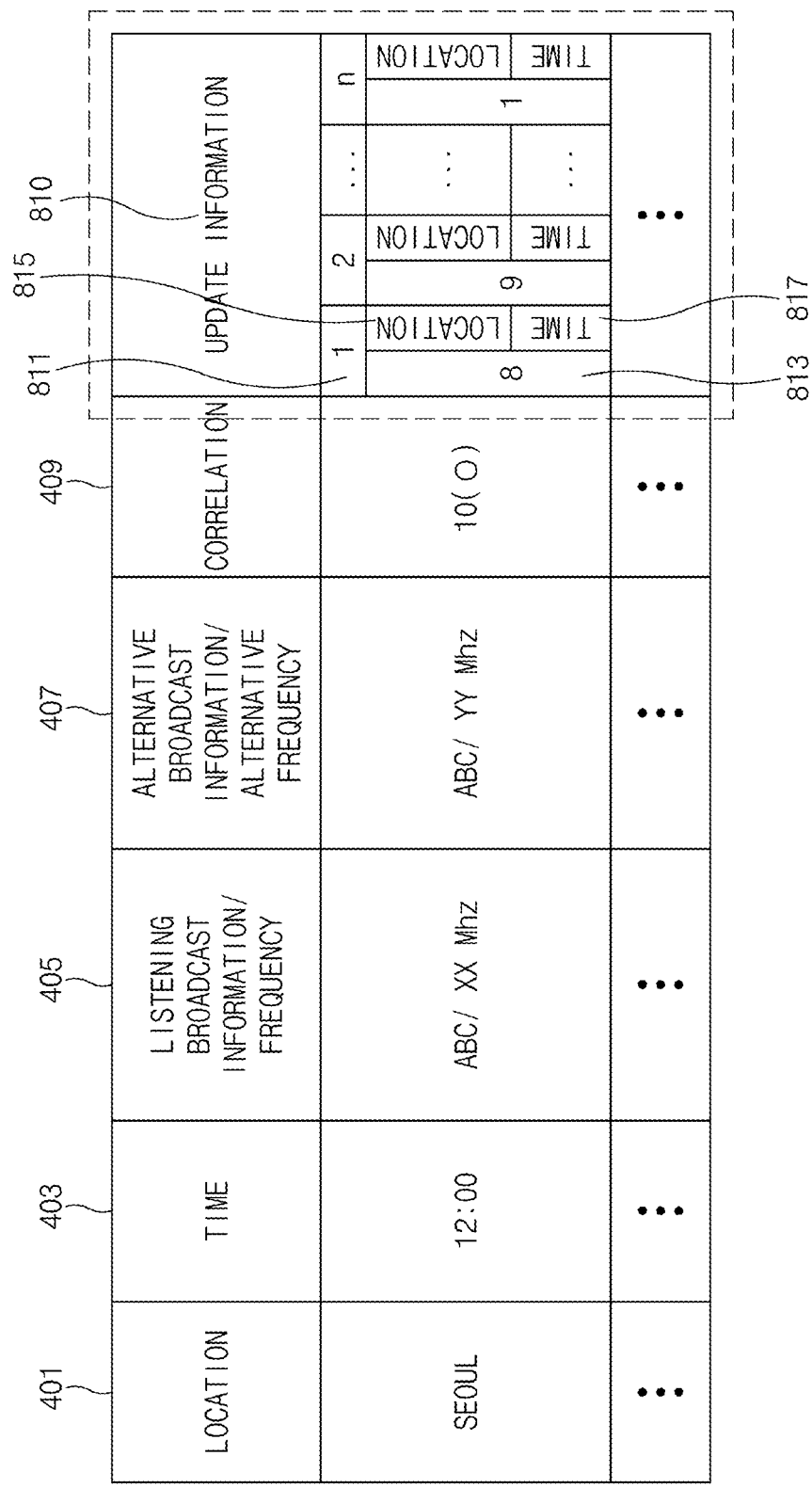
FIG. 8 is a drawing for describing updated first correlation information according to various embodiments.

FIG. 7 is a flowchart for describing an operation of storing a first correlation in an audio system according to various embodiments. FIG. 8 is a drawing for describing updated first correlation information according to various embodiments. Operations of FIG. 7, which will be described below, may indicate various embodiments for operation 540 of FIG. 5. Furthermore, respective operations in an exemplary embodiment below may be sequentially performed or an order of the respective operations may be changed. Furthermore, at least two of operations below may be performed in parallel, and at least one of the operations below may be omitted according to an exemplary embodiment of the present disclosure.

Referring to FIG. 7, in operation 710, an audio system 110 (e.g., a control device 108) according to various embodiments of the present disclosure may be configured to determine whether a change to a radio broadcast is detected. According to an exemplary embodiment of the present disclosure, the control device 108 may be configured to determine whether an input indicating a change to a second radio broadcast (e.g., a news broadcast) different from the currently received radio broadcast (e.g., a traffic broadcast) is received.

According to various exemplary embodiments of the present disclosure, when the change to the other radio broadcast is detected, in operation 740, the audio system 110 (e.g., the control device 108) may switch a setting frequency of a main tuner 203 to the radio frequency and may receive a broadcast signal for the switched frequency.

According to various exemplary embodiments of the present disclosure, when the change to the other radio broadcast is not detected, in operations 720 and 730, the audio system 110 (e.g., the control device 108) may periodically or continuously receive the second broadcast signal and may update a first correlation based on the second broadcast signal. For example, the control device 108 may monitor a correlation based on a first broadcast signal (e.g., the first broadcast signal received in operation 310 of FIG. 3) and the second broadcast signal periodically or continuously received through a sub-tuner 204. According to an exemplary embodiment of the present disclosure, the control device 108 may monitor a correlation for the second broadcast signal which varies with a change in location of the vehicle 100 and/or a change in time and may update the first correlation for the second broadcast signal based on the monitored result.

For example, as shown in FIG. 8, the control device 108 may be configured to determine the first correlation continuously or periodically 811 and may update 810 the determined result 813 in conjunction with location information 815 and time information 817. Thus, like operation 350 of FIG. 3, when receive sensitivity of the broadcast signal is less than second reference sensitivity, the control device 108 may select a fourth radio frequency corresponding to a current time and/or a location of a vehicle 100.

Figure 9:
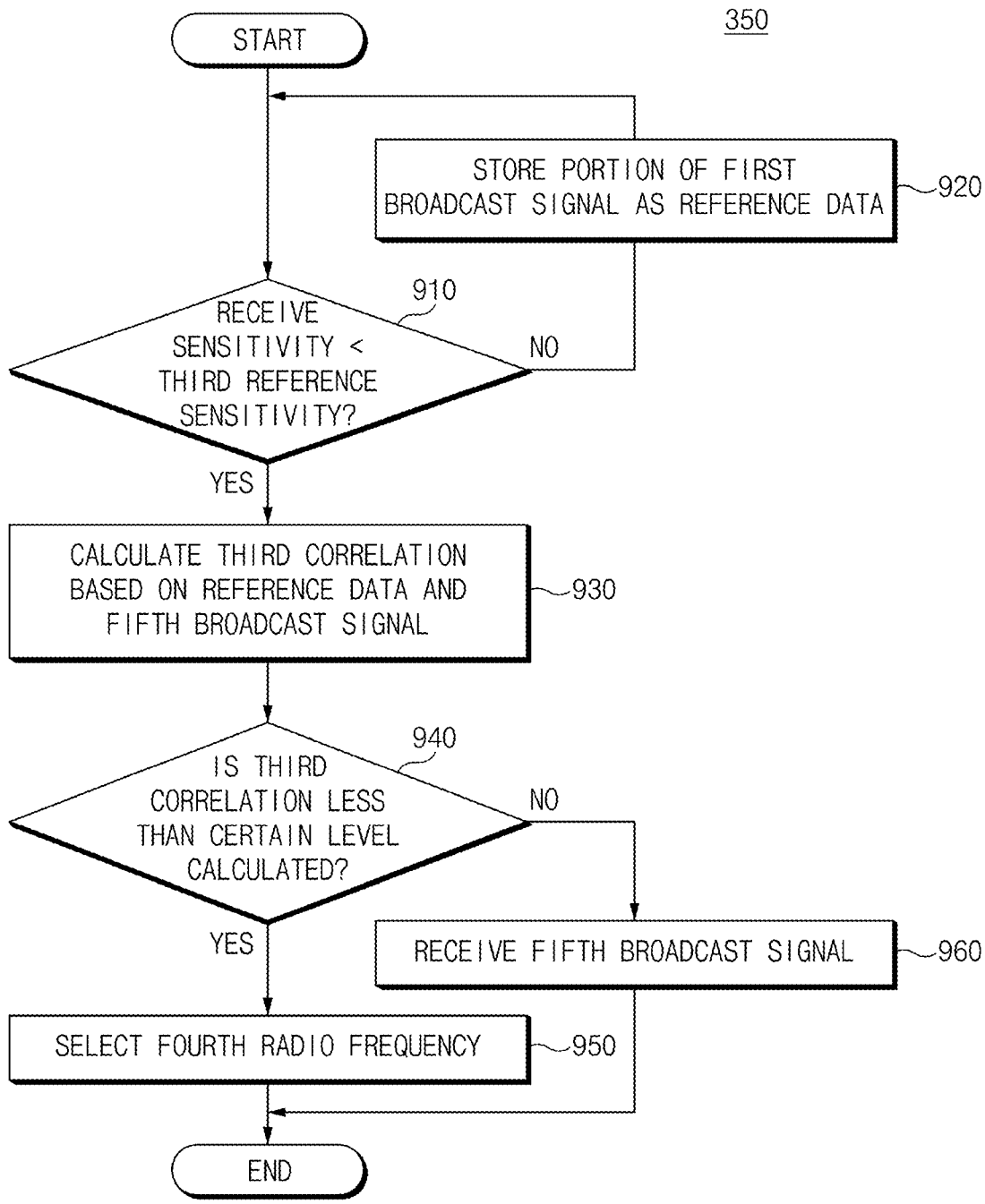
FIG. 9 is a flowchart for describing an operation of receiving a fourth broadcast signal in an audio system according to various embodiments.

FIG. 9 is a flowchart for describing an operation of receiving a fourth broadcast signal in an audio system according to various embodiments. Operations of FIG. 9, which will be described below, may indicate various embodiments for operation 350 of FIG. 3. Furthermore, respective operations in an exemplary embodiment below may be sequentially performed or an order of the respective operations may be changed. Furthermore, at least two of operations below may be performed in parallel, and at least one of the operations below may be omitted according to an exemplary embodiment of the present disclosure.

Referring to FIG. 9, in operation 910, an audio system 110 (e.g., a control device 108) according to various embodiments of the present disclosure may be configured to determine whether receive sensitivity for a first broadcast signal (e.g., the first broadcast signal received in operation 310 of FIG. 3) is less than third reference sensitivity. The third reference sensitivity may be signal sensitivity which is a criterion for determining a situation where it is impossible to extract a unique feature from a radio broadcast currently received through a first radio frequency.

According to various exemplary embodiments of the present disclosure, when the receive sensitivity for the first broadcast signal is greater than or equal to the third reference sensitivity, in operation 920, the audio system 110 (e.g., the control device 108) may store a portion of the first broadcast signal as reference data. According to an exemplary embodiment of the present disclosure, the control device 108 may extract a unique feature from the previously stored reference data in the situation where the receive sensitivity for the first broadcast signal is less than the third reference sensitivity and may use the extracted unique feature as a feature of the first broadcast signal.

According to various exemplary embodiments of the present disclosure, when the receive sensitivity for the first broadcast signal is less than the third reference sensitivity, in operation 930, the audio system 110 (e.g., the control device 108) may be configured to determine a third correlation based on the reference data and a fifth broadcast signal. The fifth broadcast signal may be a broadcast signal of a fifth radio frequency for broadcasting the same radio broadcast as the radio broadcast received through the first radio frequency at a time point when the receive sensitivity for the first broadcast signal is less than the third reference sensitivity. For example, the control device 108 may receive the fifth broadcast signal through a sub-tuner 204 and may use the fifth broadcast signal to determine the third correlation. According to an exemplary embodiment of the present disclosure, when the same unique feature is extracted in a certain level or more from the reference data and the fifth broadcast signal, the control device 108 may assign a correlation indicating that the radio broadcasts are the same broadcast.

According to various exemplary embodiments of the present disclosure, in operation 940, the audio system 110 (e.g., the control device 108) may verify whether the third correlation of a certain level or more is determined. In other words, the control device 108 may be configured to determine whether the same radio broadcast is received through the fifth radio frequency (e.g., the sub-tuner 204).

According to various exemplary embodiments of the present disclosure, when the third correlation less than the certain level is determined (e.g., when it is determined that the same radio broadcast is not received through the fifth radio frequency), in operation 950, the audio system 110 (e.g., the control device 108) may obtain a fourth radio frequency based on first correlation information (e.g., the first correlation information determined in operation 370 of FIG. 3) and may receive a fourth broadcast signal. For example, the control device 108 may switch a setting frequency of a main tuner 203 from the first radio frequency to the fourth radio frequency to receive the fourth broadcast signal.

According to various exemplary embodiments of the present disclosure, when the third correlation of the certain level or more is determined (e.g., when it is determined that the same radio broadcast is received through the fifth radio frequency), in operation 960, the audio system 110 (e.g., the control device 108) may receive and output a fifth broadcast signal. For example, the control device 108 may switch a setting frequency of the main tuner 203 from the first radio frequency to the fifth radio frequency to receive the fifth broadcast signal.

Figure 10:
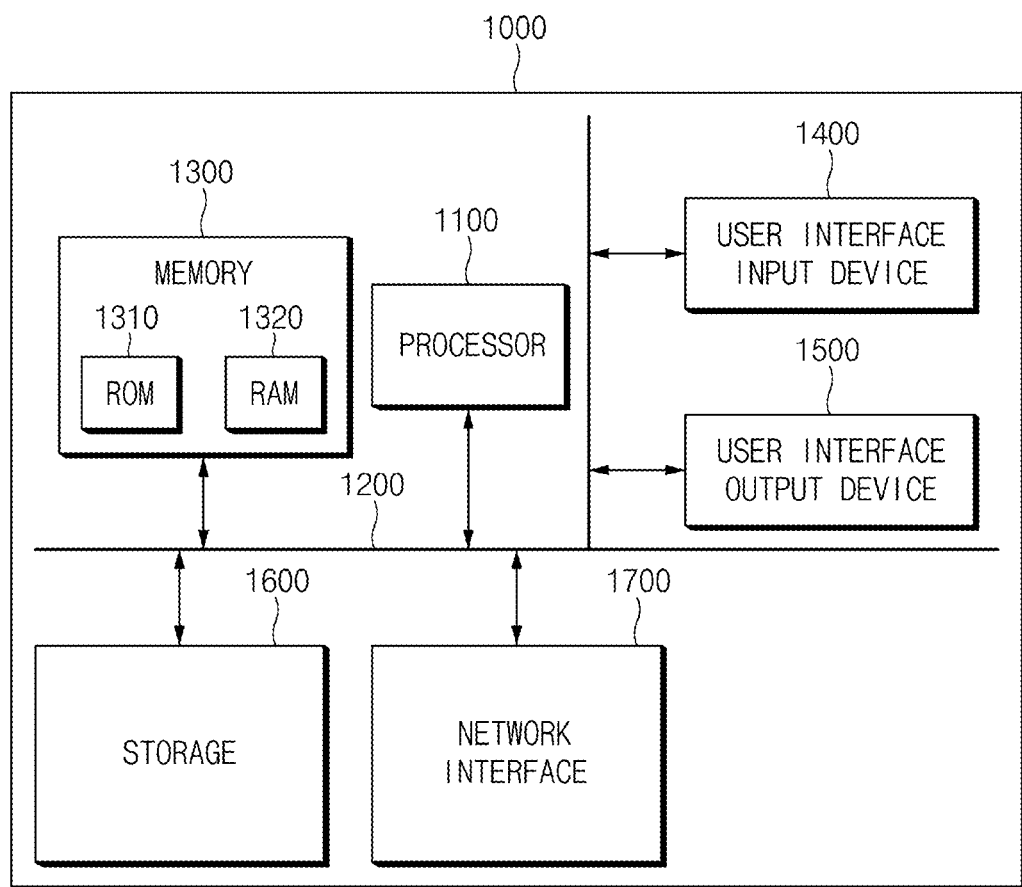
FIG. 10 is a drawing illustrating a configuration of a computing system for executing the method according to an exemplary embodiment of the present disclosure.

FIG. 10 is a drawing illustrating a configuration of a computing system for executing the method according to an exemplary embodiment of the present disclosure.

Referring to FIG. 10, a computing system 1000 may include at least one processor 1100, a memory 1300, a user interface input device 1400, a user interface output device 1500, a storage 1060, and a network interface 1700, which are connected to each other via a bus 1200.

The processor 1100 may be a central processing unit (CPU) or a semiconductor device that processes instructions stored in the memory 1300 and/or the storage 1600. The memory 1300 and the storage 1600 may include various types of volatile or non-volatile storage media. For example, the memory 1300 may include a read only memory (ROM) 1310 and a random access memory (RAM) 1320.

Accordingly, the operations of the method or algorithm described in connection with the exemplary embodiments included in the specification may be directly implemented with a hardware module, a software module, or a combination of the hardware module and the software module, which is executed by the processor 1100. The software module may reside on a storage medium (that is, the memory 1300 and/or the storage 1600) such as a RAM, a flash memory, a ROM, an EPROM, an EEPROM, a register, a hard disc, a removable disk, and a CD-ROM. The exemplary storage medium may be coupled to the processor 1100. The processor 1100 may read out information from the storage medium and may write information in the storage medium. Alternatively, the storage medium may be integrated with the processor 1100. The processor 110 and the storage medium may reside in an application specific integrated circuit (ASIC). The ASIC may reside within a user terminal. In another case, the processor 1100 and the storage medium may reside in the user terminal as separate components.

The audio system according to various exemplary embodiments included in the present disclosure may automatically switch to another radio frequency for transmitting the same radio broadcast as a currently received radio broadcast even in a situation where the radio broadcast which has quality of a certain level or less is received as the vehicle enters shadow area or the like and may constantly provide a passenger with a radio service.

Furthermore, various effects ascertained directly or indirectly through the present disclosure may be provided.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In the present specification, unless stated otherwise, a singular expression includes a plural expression unless the context clearly indicates otherwise.

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An audio system, comprising:
  an audio device; and
  a control device operationally connected to the audio device and configured to set a frequency of the audio device to a first radio frequency corresponding to a selected radio broadcast and receive a first broadcast signal,
  wherein the control device is configured to:
    receive a second broadcast signal for an alternative frequency associated with the first broadcast signal with receive sensitivity of predetermined first reference sensitivity or more than the predetermined first reference sensitivity while the first broadcast signal is received through the audio device and verify and store a second radio frequency for transmitting a same broadcast as a radio broadcast of the first radio frequency based on a comparison between the first broadcast signal and the second broadcast signal;
    receive a third broadcast signal for the alternative frequency, in response that the first broadcast signal with receive sensitivity less than the predetermined first reference sensitivity, but greater than or equal to predetermined second reference sensitivity is received, and change the frequency of the audio device from the first radio frequency to a third radio frequency corresponding to the alternative frequency based on a comparison between the first broadcast signal and the third broadcast signal; and
    change the frequency of the audio device based on the second radio frequency, in response that the first broadcast signal with receive sensitivity less than the predetermined second reference sensitivity is received.

2. The audio system of claim 1,
  wherein the audio device includes a main tuner and a sub-tuner,
  wherein the second broadcast signal and the third broadcast signal are received through the sub-tuner, and
  wherein the control device is further configured to change a frequency of the main tuner.

3. The audio system of claim 1, wherein the control device is further configured to:
  store a plurality of second radio frequencies, while the first broadcast signal with the receive sensitivity of the predetermined first reference sensitivity or more than the predetermined first reference sensitivity is received; and obtain at least one of location information or time information associated with the audio system and change the frequency of the audio device to fourth radio frequency corresponding to the at least one of the location information or the time information among the second radio frequencies, in response that the first broadcast signal with the receive sensitivity less than the predetermined second reference sensitivity is received.

4. The audio system of claim 1, wherein the control device is further configured to:

change the frequency of the audio device from the first radio frequency to the third radio frequency, in response that receive sensitivity of the third broadcast signal is better than the receive sensitivity of the first broadcast signal; and control a predetermined operation of the audio device, in response that the receive sensitivity of the first broadcast signal is better than the receive sensitivity of the third broadcast signal, and wherein the predetermined operation of the audio device includes at least one of an operation of receiving a radio broadcast different from the selected radio broadcast, an operation of stopping receiving the radio broadcast, or an operation of playing a sound source stored in a storage medium.

5. The audio system of claim 1, wherein the control device is further configured to:

change the frequency of the audio device from the first radio frequency to the third radio frequency, in response that the first broadcast signal and the third broadcast signal are verified as broadcast signals of the same radio broadcast based on the comparison between the first broadcast signal and the third broadcast signal; and control a predetermined operation of the audio device, in response that the first broadcast signal and the third broadcast signal are verified as broadcast signals of different radio broadcasts based on the comparison, and wherein the predetermined operation of the audio device includes at least one of an operation of receiving a radio broadcast different from the selected radio broadcast, an operation of stopping receiving the radio broadcast, or an operation of playing a sound source stored in a storage medium.

6. The audio system of claim 1, wherein the control device is further configured to:

store at least a portion of the first broadcast signal as reference data, while the first broadcast signal with the receive sensitivity less than the predetermined first reference sensitivity, but greater than or equal to the predetermined second reference sensitivity is received; and receive a fifth broadcast signal for the alternative frequency, in response that the first broadcast signal with the receive sensitivity less than the predetermined second reference sensitivity is received, and change the frequency of the audio device based on the second radio frequency, in response that the stored reference data and the fifth broadcast signal are verified as broadcast signals of different radio broadcasts.

7. The audio system of claim 6, wherein the control device is further configured to:

change the frequency of the audio device based on the alternative frequency, in response that the stored reference data and the fifth broadcast signal are verified as broadcast signals of the same radio broadcast.

8. The audio system of claim 1, wherein the control device is further configured to obtain information related to the alternative frequency from an inside of the audio system or an outside of the audio system.

9. The audio system of claim 1, wherein the control device is further configured to:

verify the second radio frequency based on a comparison between a first feature extracted from the first broadcast signal and a second feature extracted from the second broadcast signal.

10. The audio system of claim 1, wherein the control device is further configured to:

verify the third radio frequency based on a comparison between a first feature extracted from the first broadcast signal and a third feature extracted from the third broadcast signal.

11. An operation method of an audio system, the operation method comprising:

setting, by a control device, a frequency of an audio device included in the audio system to a first radio frequency corresponding to a selected radio broadcast and receiving a first broadcast signal;

receiving, by the control device, a second broadcast signal for an alternative frequency associated with the first broadcast signal with receive sensitivity of predetermined first reference sensitivity or more than the predetermined first reference sensitivity, while the first broadcast signal is received through the audio device, and verifying and storing a second radio frequency for transmitting a same broadcast as a radio broadcast of the first radio frequency based on a comparison between the first broadcast signal and the second broadcast signal;

receiving, by the control device, a third broadcast signal for the alternative frequency, in response that the first broadcast signal with receive sensitivity less than the predetermined first reference sensitivity, but greater than or equal to predetermined reference sensitivity is received, and changing the frequency of the audio device from the first radio frequency to a third radio frequency corresponding to the alternative frequency based a comparison between the first broadcast signal and the third broadcast signal; and changing, by the control device, the frequency of the audio device based on the second radio frequency, in response that the first broadcast signal with receive sensitivity less than the predetermined second reference sensitivity is received.

12. The operation method of claim 11, wherein the audio device includes a main tuner and a sub-tuner, and wherein the method further includes:

receiving the second broadcast signal and the third broadcast signal through the sub-tuner of the audio device; and changing a frequency of the main tuner of the audio device.

13. The operation method of claim 11, further including:

storing, by the control device, a plurality of second radio frequencies, while the first broadcast signal with the receive sensitivity greater than or equal to the predetermined first reference sensitivity is received; and obtaining, by the control device, at least one of location information or time information and changing the frequency of the audio device to a fourth radio frequency corresponding to the at least one of the location information or the time information among the second radio frequencies, in response that the first broadcast signal with the receive sensitivity less than the predetermined second reference sensitivity is received.

14. The operation method of claim 11, further including:

changing, by the control device, the frequency of the audio device from the first radio frequency to the third radio frequency, in response that receive sensitivity of the third broadcast signal is better than the receive sensitivity of the first broadcast signal; and controlling, by the control device, a predetermined operation of the audio device, in response that the receive sensitivity of the first broadcast signal is better than the receive sensitivity of the third broadcast signal, wherein the predetermined operation of the audio device includes at least one of an operation of receiving a radio broadcast different from the selected radio broadcast, an operation of stopping receiving the radio broadcast, or an operation of playing a sound source stored in a storage medium.

15. The operation method of claim 11, further including:

changing, by the control device, the frequency of the audio device from the first radio frequency to the third radio frequency, in response that the first broadcast signal and the third broadcast signal are verified as broadcast signals of the same radio broadcast based on the comparison between the first broadcast signal and the third broadcast signal; and controlling, by the control device, a predetermined operation of the audio device, in response that the first broadcast signal and the third broadcast signal are verified as broadcast signals of different radio broadcasts based on the comparison, wherein the predetermined operation of the audio device includes at least one of an operation of receiving a radio broadcast different from the selected radio broadcast, an operation of stopping receiving the radio broadcast, or an operation of playing a sound source stored in a storage medium.

16. The operation method of claim 11, further including:

storing, by the control device, at least a portion of the first broadcast signal as reference data, while the first broadcast signal with the receive sensitivity less than the predetermined first reference sensitivity, but greater than or equal to the predetermined second reference sensitivity is received; and receiving, by the control device, a fifth broadcast signal for the alternative frequency, in response that the first broadcast signal with the receive sensitivity less than the predetermined second reference sensitivity is received, and changing the frequency of the audio device based on the second radio frequency, in response that the stored reference data and the fifth broadcast signal are verified as broadcast signals of different radio broadcasts.

17. The operation method of claim 16, further including:

changing, by the control device, the frequency of the audio device based on the alternative frequency, in response that the stored reference data and the fifth broadcast signal are verified as broadcast signals of the same radio broadcast.

18. The operation method of claim 11, further including:

obtaining, by the control device, information related to the alternative frequency from an inside of the audio system or an outside of the audio system.

19. The operation method of claim 11, further including:

verifying, by the control device, the second radio frequency based on a comparison between a first feature extracted from the first broadcast signal and a second feature extracted from the second broadcast signal.

20. The operation method of claim 11, further including:

verifying, by the control device, the third radio frequency based on a comparison between a first feature extracted from the first broadcast signal and a third feature extracted from the third broadcast signal.

* * * * *